(12) United States Patent
Jain et al.

(10) Patent No.: US 10,804,364 B2
(45) Date of Patent: Oct. 13, 2020

(54) TUNABLE BREAKDOWN VOLTAGE RF FET DEVICES

(71) Applicant: INTERNATIONAL BUSINESS MACHINES CORPORATION, Armonk, NY (US)

(72) Inventors: Vibhor Jain, Essex Junction, VT (US); Qizhi Liu, Lexington, MA (US); John J. Pekarik, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/031,371

(22) Filed: Jul. 10, 2018

(65) Prior Publication Data
US 2018/0323268 A1   Nov. 8, 2018

Related U.S. Application Data

(60) Continuation of application No. 14/864,066, filed on Sep. 24, 2015, now Pat. No. 10,090,391, which is a
(Continued)

(51) Int. Cl.
*H01L 29/417* (2006.01)
*H01L 29/78* (2006.01)
(Continued)

(52) U.S. Cl.
CPC .. *H01L 29/41775* (2013.01); *H01L 21/28052* (2013.01); *H01L 29/665* (2013.01);
(Continued)

(58) Field of Classification Search
None
See application file for complete search history.

(56) References Cited

U.S. PATENT DOCUMENTS

| 4,566,021 A | 1/1986 | Yokoyama |
| 4,745,086 A | 5/1988 | Parrillo et al. |

(Continued)

FOREIGN PATENT DOCUMENTS

| KR | 1020050065172 A | 6/2005 |
| KR | 100850091 B1 | 7/2008 |
| KR | 101044775 B1 | 6/2011 |

OTHER PUBLICATIONS

List of IBM Patents or Patent Applications Treated as Related 1 page.
(Continued)

*Primary Examiner* — Vincent Wall
(74) *Attorney, Agent, or Firm* — Alvin Borromeo; Andrew M. Calderon; Roberts Calderon Safran & Cole, P.C.

(57) ABSTRACT

A tunable breakdown voltage RF MESFET and/or MOSFET and methods of manufacture are disclosed. The method includes forming a first line and a second line on an underlying gate dielectric material. The second line has a width tuned to a breakdown voltage. The method further includes forming sidewall spacers on sidewalls of the first and second line such that the space between first and second line is pinched-off by the dielectric spacers. The method further includes forming source and drain regions adjacent outer edges of the first line and the second line, and removing at least the second line to form an opening between the sidewall spacers of the second line and to expose the underlying gate dielectric material. The method further includes depositing a layer of material on the underlying gate dielectric material within the opening, and forming contacts to a gate structure and the source and drain regions.

20 Claims, 6 Drawing Sheets

US 10,804,364 B2
Page 2

Related U.S. Application Data division of application No. 14/300,884, filed on Jun. 10, 2014, now Pat. No. 10,038,063.

(51) Int. Cl.

| | |
|---|---|
| *H01L 29/66* | (2006.01) |
| *H01L 21/28* | (2006.01) |
| *H01L 29/812* | (2006.01) |
| *H01L 29/49* | (2006.01) |
| *H01L 29/47* | (2006.01) |
| *H01L 27/12* | (2006.01) |
| *H01L 29/51* | (2006.01) |

(52) U.S. Cl.
CPC .... *H01L 29/6656* (2013.01); *H01L 29/66659* (2013.01); *H01L 29/66848* (2013.01); *H01L 29/7835* (2013.01); *H01L 29/812* (2013.01); H01L 27/1203 (2013.01); H01L 29/47 (2013.01); H01L 29/4933 (2013.01); H01L 29/518 (2013.01); H01L 29/66871 (2013.01); H01L 2924/0002 (2013.01)

(56) References Cited

U.S. PATENT DOCUMENTS

| | | | |
|---|---|---|---|
| 5,389,807 A | 2/1995 | Shiga | |
| 5,668,024 A | 9/1997 | Tsai et al. | |
| 5,904,529 A * | 5/1999 | Gardner | H01L 21/28123 257/E21.206 |
| 6,005,267 A | 12/1999 | Griffin et al. | |
| 6,127,845 A | 10/2000 | Kolze et al. | |
| 6,271,132 B1 | 8/2001 | Xiang et al. | |
| 6,312,997 B1 | 11/2001 | Tran | |
| 6,380,042 B1 | 4/2002 | Huang | |
| 6,407,435 B1 | 6/2002 | Ma et al. | |
| 6,562,676 B1 | 5/2003 | Ju | |
| 6,627,504 B1 | 9/2003 | Bertrand et al. | |
| 6,686,233 B2 | 2/2004 | Söderbärg et al. | |
| 6,849,541 B1 | 2/2005 | Hu et al. | |
| 7,091,118 B1 | 8/2006 | Pan et al. | |
| 7,256,113 B1 | 8/2007 | Hellig et al. | |
| 7,391,083 B2 | 6/2008 | Kato et al. | |
| 7,649,225 B2 | 1/2010 | Cai et al. | |
| 7,663,237 B2 | 2/2010 | Peng et al. | |
| 7,732,293 B2 | 6/2010 | Voldman | |
| 8,067,807 B2 | 11/2011 | Taya | |
| 8,076,720 B2 | 12/2011 | Shimada et al. | |
| 8,247,869 B2 | 8/2012 | Yang et al. | |
| 8,390,057 B1 | 3/2013 | Zuniga et al. | |
| 8,415,763 B2 | 4/2013 | Harame et al. | |
| 8,450,814 B2 | 5/2013 | Zinn | |
| 8,482,054 B2 | 7/2013 | Sakaguchi | |
| 9,455,701 B1 | 9/2016 | Titus | |
| 9,543,435 B1 | 1/2017 | Basker et al. | |
| 9,923,100 B2 | 3/2018 | Zou | |
| 10,038,063 B2 | 7/2018 | Jain et al. | |
| 2002/0030278 A1 | 3/2002 | Weber | |
| 2003/0178688 A1 | 9/2003 | Yang et al. | |
| 2004/0108548 A1 | 6/2004 | Cal | |
| 2005/0064690 A1 | 3/2005 | Amos et al. | |
| 2005/0093105 A1 | 5/2005 | Yang et al. | |
| 2005/0199921 A1 | 9/2005 | Hsu et al. | |
| 2006/0091498 A1* | 5/2006 | Sriram | H01L 29/0692 257/578 |
| 2006/0128151 A1 | 6/2006 | Ryu | |
| 2006/0131676 A1 | 6/2006 | Saito et al. | |
| 2006/0199320 A1 | 9/2006 | Dyer et al. | |
| 2007/0187756 A1* | 8/2007 | Snyder | H01L 29/0839 257/343 |
| 2008/0057599 A1 | 3/2008 | Kobashi et al. | |
| 2008/0090360 A1 | 4/2008 | Krivokapic | |
| 2008/0182394 A1 | 7/2008 | Yang et al. | |
| 2009/0230463 A1 | 9/2009 | Carter et al. | |
| 2009/0256214 A1* | 10/2009 | Sun | H01L 21/76897 257/411 |
| 2009/0261426 A1 | 10/2009 | Feilchenfeld et al. | |
| 2011/0034018 A1 | 2/2011 | Atherton | |
| 2011/0136313 A1 | 6/2011 | Lee et al. | |
| 2011/0171820 A1 | 7/2011 | Tsau et al. | |
| 2011/0193161 A1 | 8/2011 | Zhu et al. | |
| 2012/0256238 A1* | 10/2012 | Ning | H01L 21/84 257/280 |
| 2013/0087861 A1 | 8/2013 | Chen et al. | |
| 2013/0214336 A1 | 8/2013 | Hsu et al. | |
| 2013/0264640 A1 | 10/2013 | Salman et al. | |
| 2013/0267074 A1 | 10/2013 | Hall et al. | |
| 2014/0070315 A1 | 3/2014 | Levy et al. | |
| 2015/0119252 A1 | 4/2015 | Ladizinsky et al. | |
| 2015/0357467 A1 | 12/2015 | Jain et al. | |
| 2016/0013208 A1 | 1/2016 | Jain et al. | |
| 2016/0013290 A1 | 1/2016 | Jain et al. | |
| 2016/0043176 A1 | 2/2016 | Wang | |
| 2016/0240526 A1 | 8/2016 | Titus | |
| 2017/0162389 A1 | 6/2017 | Chen et al. | |
| 2018/0069088 A1 | 3/2018 | Jain et al. | |
| 2018/0226477 A1 | 8/2018 | Jain et al. | |

OTHER PUBLICATIONS

Specification and Drawings for "Turnable Breakdown Voltage RF FET Devices" for related U.S. Appl. No. 16/050,230, filed Jul. 31, 2018, 26 pages.

Office Action from U.S. Appl. No. 15/811,810 dated Aug. 16, 2018. 19 pages.

Wilk et al., "Silicon-on-insulator mesfets at the 45NM node", International Journal of High Speed Electronics and Systems, Dec. 2012, pp. 1-16.

Sarcona, Greg T., "Polysilicon Thin-Film Transistors Using Self-Aligned Cobalt and Nickel Silicide Source and Drain Contacts", IEEE Electron Device Letters, vol. 20, No. 7, Jul. 1999, pp. 332-334 (Year: 1999).

Office Action from U.S. Appl. No. 15/944,018 dated Dec. 27, 2018; 14 pages.

Office Action from U.S. Appl. No. 15/811,810 dated Mar. 5, 2019; 12 pages.

Office Action from U.S. Appl. No. 15/944,018 dated Mar. 28, 2019; 17 pages.

Gupta, Tapan K., "Copper Interconnect Technology", DOI 101007/978-1-4419-0076-0_2, Springer Science+Business Media, LLC 2000, pp. 67-110.

Specification and Drawings for "Tunable Breakdown Voltage RF FET Devices" for related U.S. Appl. No. 15/982,370, filed May 17, 2018, 27 pages.

Specification and Drawings for "Tunable Breakdown Voltage RF FET Devices" for related U.S. Appl. No. 15/944,018, filed Apr. 3, 2018, 27 pages.

Office Action dated Aug. 6, 2019 in related U.S. Appl. No. 15/982,370, 18 pages.

Final Office Action dated Aug. 9, 2019 in related U.S. Appl. No. 15/811,810, 19 pages.

Office Action dated Sep. 23, 2019 in related U.S. Appl. No. 16/050,230, 15 pages.

Office Action dated Sep. 5, 2019 in related U.S. Appl. No. 15/944,018, 14 pages.

Final Office Action dated Feb. 19, 2020 in U.S. Appl. No. 16/050,230, 16 pages.

Notice of Allowance dated May 1, 2020 in U.S. Appl. No. 15/982,370, 12 pages.

Notice of Allowance dated Dec. 12, 2019 in U.S. Appl. No. 15/811,810, 13 pages.

Final Office Action dated Dec. 18, 2019 in U.S. Appl. No. 15/982,370, 13 pages.

Notice of Allowance dated Feb. 3, 2020 in U.S. Appl. No. 15/944,018, 9 pages.

(56) References Cited

OTHER PUBLICATIONS

Notice of Allowance dated May 15, 2020 in related U.S. Appl. No. 16/050,230, 12 pages.

* cited by examiner

TUNABLE BREAKDOWN VOLTAGE RF FET DEVICES

FIELD OF THE INVENTION

The invention relates to semiconductor structures and, more particularly, to tunable breakdown voltage RF MESFETs and MOSFETs and methods of manufacture.

BACKGROUND

MESFETs (metal-semiconductor field effect transistor) and HEMTs (high electron mobility transistors) are usually constructed in compound semiconductor technologies, and are faster but more expensive than silicon-based JFETs or MOSFETs (metal-oxide-semiconductor field-effect transistor). MESFETs are commonly used for microwave frequency communications and radar. For example, MESFETs/HEMTs can be used in cascode circuits for cellular power amplifier applications. However, it is increasingly difficult to use MESFETs as the basis for integrated circuits as the scale of integration increases, compared to CMOS silicon based fabrication.

MOSFETs are typically used for amplifying or switching electronic signals. MOSFETs are voltage-controlled power devices; that is, if no positive voltage is applied between gate and source the MOSFET is always non-conducting (enhancement mode MOSFET). For depletion mode MOSFET, the MOSFET is conducting even if the applied voltage between gate and source is zero. Although the MOSFET is a four-terminal device with source (S), gate (G), drain (D), and body (B) terminals, the body (or substrate) of the MOSFET is often connected to the source terminal, making it a three-terminal device like other field-effect transistors.

SUMMARY

In an aspect of the invention, a method comprises forming a first line and a second line on an underlying gate dielectric material. The second line has a width tuned to a breakdown voltage. The method further comprises forming sidewall spacers on sidewalls of the first line and the second line. The method further comprises forming source and drain regions adjacent outer edges of the first line and the second line. The method further comprises removing at least the second line to form an opening between the sidewall spacers of the second line and to expose the underlying gate dielectric material. The method further comprises depositing a layer of material on the underlying gate dielectric material within the opening. The method further comprises forming contacts to a gate structure and the source and drain regions.

In an aspect of the invention, a method comprises: forming a gate dielectric material on a substrate; forming a first line and a second line on the gate dielectric material; forming sidewall spacers on the first line and the second line, wherein the sidewall spacers between the first line and the second line define a minimum spacing, and the sidewall spacers pinch off the minimum spacing; forming source and drain regions adjacent outer edges of the first line and the second line; removing at least the second line to form an opening between the sidewall spacers of the second line and to expose the gate dielectric material; depositing a layer of material on the gate dielectric material within the opening; and forming contacts to a gate structure and the source and drain regions.

In an aspect of the invention, a structure comprises: a gate dielectric material on a substrate; a gate structure on the substrate; sidewall spacers on the gate structure and a sidewall structure remote from the gate structure forming an opening therebetween; a source region adjacent to the gate structure; a drain region remote from the gate structure and aligned with the sidewall structure; a layer of material on the gate dielectric material within the opening; and contacts to the gate structure and the source and drain regions.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MESFETs and MOSFETs, which comprises the structures of the present invention. In still further embodiments, a method in a computer-aided design system is provided for generating a functional design model of the MESFETs and MOSFETs. The method comprises generating a functional representation of the structural elements of the MESFETs and MOSFETs.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to tunable breakdown voltage RF MESFETs and MOSFETs and methods of manufacture. More specifically, the present invention is directed to forming tunable breakdown voltage RF MESFETs and MOSFETs in CMOS process flows and resultant structures. The present invention is particularly useful in manufacturing high breakdown voltage MESFETs used in cascode circuits for cellular power amplifier (PA) applications, communication systems and test instruments. The methods of the present invention can also be used to manufacture other devices such as, for example, RF LDMOS (laterally diffused metal oxide semiconductor) devices or HEMTs.

Advantageously, the methods of forming the tunable breakdown voltage MESFET and/or MOSFET only use a single extra mask to define independently the gate length and gate-drain drift region. This provides circuit designers with great flexibility to tune the breakdown voltage of MESFET/MOSFET/LDMOS in a CMOS process flow in addition to the availability of on-chip CMOS/BiCMOS devices. The methods of the present invention further provide the ability to have a self-align gate to both source and drain with adjustable gate-drain spacing (drift region). The methods of the present invention also provide the ability to form a variable spacer with tight tolerances (e.g., no overlay tolerance, only edge lithography tolerance). More specifically, the present invention provides methods to form controllable spacer widths, space out source/drain regions per poly crystalline (PC) line control, i.e., providing controlled separation between gate and drain with no overlay tolerance, as well as the ability to have dual PC lines to PC line width control.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
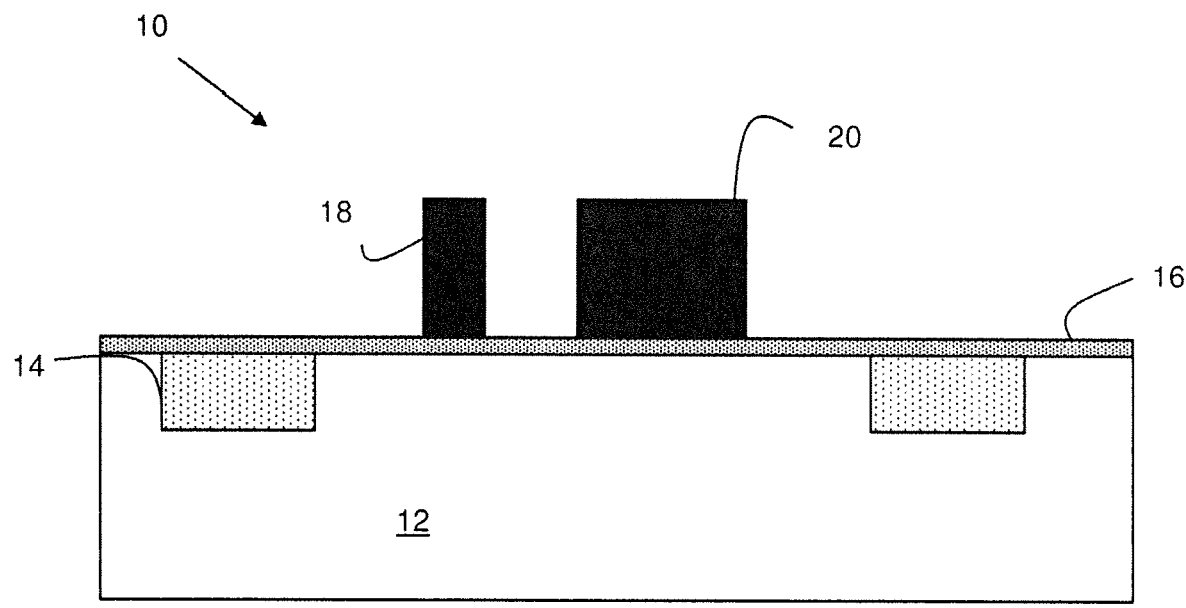
FIGS. 1-6 show processing steps and respective structures for forming MESFETs, in accordance with aspects of the present invention.

FIG. 1 shows a structure and respective processing steps in accordance with aspects of the present invention. More specifically, the structure 10 of FIG. 1 includes a substrate 12 with shallow trench isolation (STI) regions 14. In embodiments, the substrate 12 can be a BULK substrate or silicon on insulator (SOI) substrate. In any scenario, the substrate can comprise any semiconductor material such as, for example, Si, SiGe, GaAs, SiC, etc.

The STI regions 14 can be formed using conventional lithography, etching and deposition methods. For example, a resist can be formed on the substrate 12, and exposed to energy (light) to form a pattern. A reactive ion etching (RIE) with appropriate chemistry is then performed to form trenches into the substrate 12. The trenches are then filled with an insulator material, e.g., oxide, to form the STI regions 14. In embodiments, any excess insulator material on the substrate 12 can be removed using, for example, a chemical mechanical polishing (CMP) processes.

Still referring to FIG. 1, a gate dielectric material 16 is formed on the substrate 12. In embodiments, the gate dielectric material 16 can be an oxide or other gate insulator material, e.g., hafnium based materials or alumina, etc. The gate dielectric material 16 can be a thermally grown oxide, or an oxide deposited using conventional deposition methods, e.g., chemical vapor deposition (CVD) or atomic layer deposition (ALD) or Molecular Beam Epitaxy (MBE). In embodiments, the thickness of the gate dielectric material 16 can vary from about 3 Å to a few hundred angstroms; although other dimensions are also contemplated by the present invention.

Lines 18 and 20 are formed on the gate dielectric material 16, in a gate region of a device. In embodiments, the lines 18 and 20 are polycrystalline Si lines formed using conventional deposition, lithography and etching processes. For example, a polycrystalline Si is deposited on the substrate 12 using conventional CVD processes, following by a patterning step using lithography and etching processes known to those of skill in the art such that no further explanation is required for an understanding of the invention.

In embodiments, the height of the lines 18 and 20 can vary depending on the technology node, with a preferred height of about 1000 Å to 2000 Å. The widths of the lines 18 and 20 can also be tuned, e.g., adjusted, depending on the technology node, with a preferred width of the line 18 being about 10 nm to 500 nm, for a 14 nm node technology. In embodiments, the width of line 18 defines the gate length; whereas, line 20 can have a variable width for tuning breakdown voltage. The spacing between lines 18 and 20 can vary depending on spacer widths required for different technologies, e.g., ranging from about 3 nm to several hundred nanometers.

Figure 2:
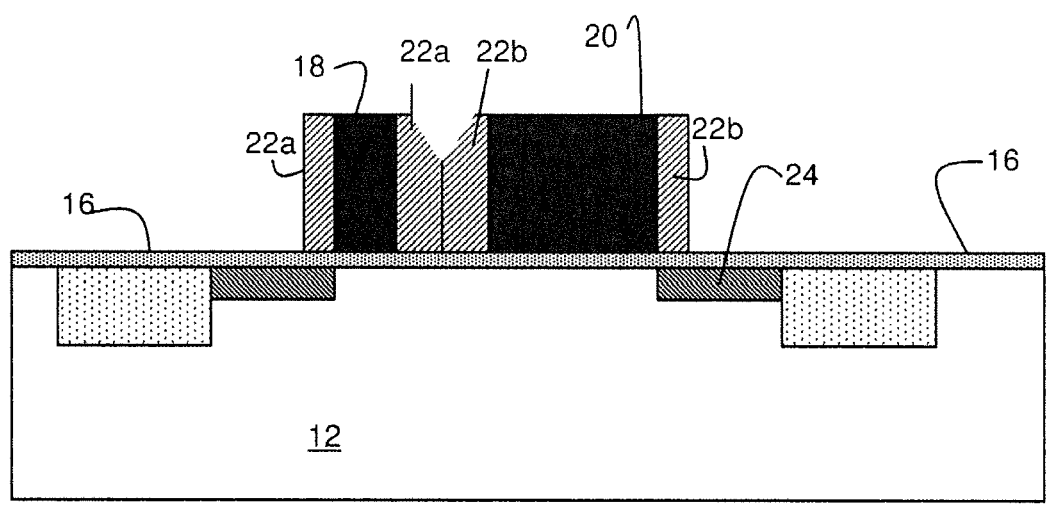

In FIG. 2, spacers 22a and 22b are formed on sides of the lines 18 and 20. In embodiments, the spacers 22a and 22b can be, for example, oxide, nitride, oxynitride, or other stacked materials. In embodiments, the spacers 22a and 22b can be formed by conventional deposition and etching processes. For example, a blanket deposition of material can be formed on the gate dielectric material 16 and lines 18 and 20. The material should be deposited to such dimensions that ensure the space between the lines 18 and 20 is pinched off, thus defining the required minimum spacing between the lines 18 and 20. The material then undergoes an anisotropic etching process to remove it from all horizontal surfaces.

Still referring to FIG. 2, source and drain regions 24 are formed using conventional ion implantation or doping processes. The source and drain regions 24 are self aligned to the lines 18 and 20, e.g., using the spacers 22a and 22b. More specifically, the source and drain regions 24 are adjacent outer edges of the first line 18 and the second line 20 and more specifically the spacers 22a and 22b formed thereon. In embodiments, reference numeral 24 can also represent conventional extension and halo implant processes. Lines 18 and 20 can also be masked using a dielectric material, e.g., oxide or nitride, to prevent the S/D or other implants from implanting the lines.

Figure 3:
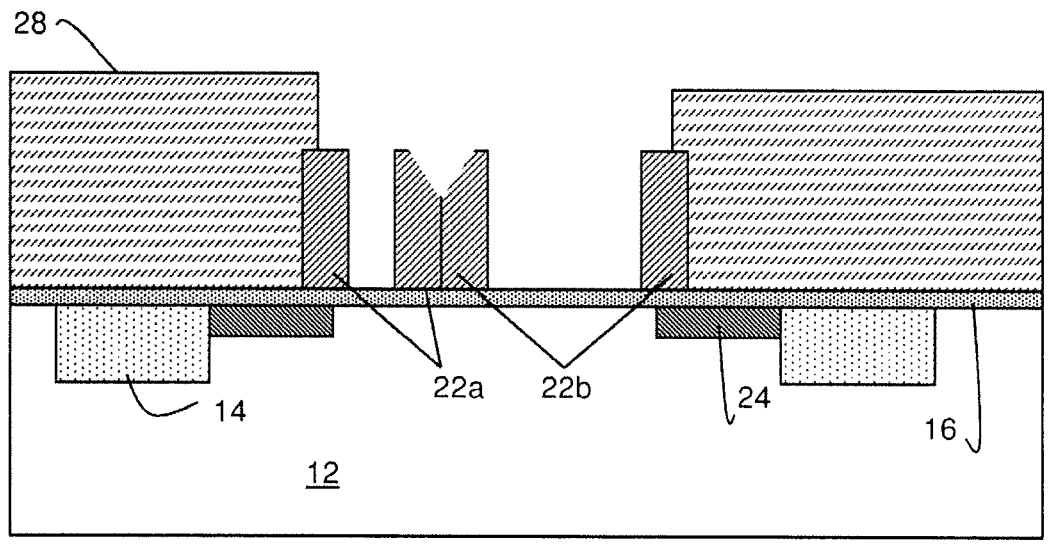

For MESFET processes, in FIG. 3, a resist 28 is formed on substrate 12, with its pattern exposing the lines 18 and 20. In embodiments, the resist boundary is formed on the outermost spacers 22a and 22b. Accordingly, the spacers 22a and 22b are designed to be sufficiently thick in order to have the resist boundary land thereon. The lines 18 and 20 are then removed using conventional etching processes, e.g., RIE or a wet etch, selective to its material.

Figure 4:
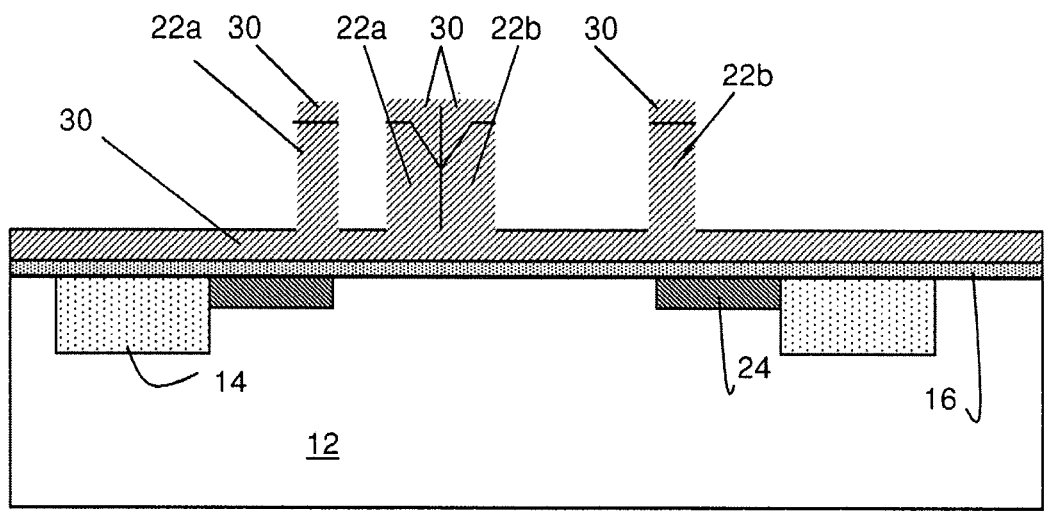

In FIG. 4, the resist is removed and a nitride layer 30 is conformally formed on the structure. More specifically, in embodiments, the resist can be removed by, for example, an oxygen ashing process or other known stripping method. The nitride layer 30 is formed by a CVD conformal deposition process over the exposed portions of the spacers 22a and 22b, and the gate dielectric material 16. In embodiments, the nitride layer 30 can be an oxynitride or other blocking material.

Figure 5:
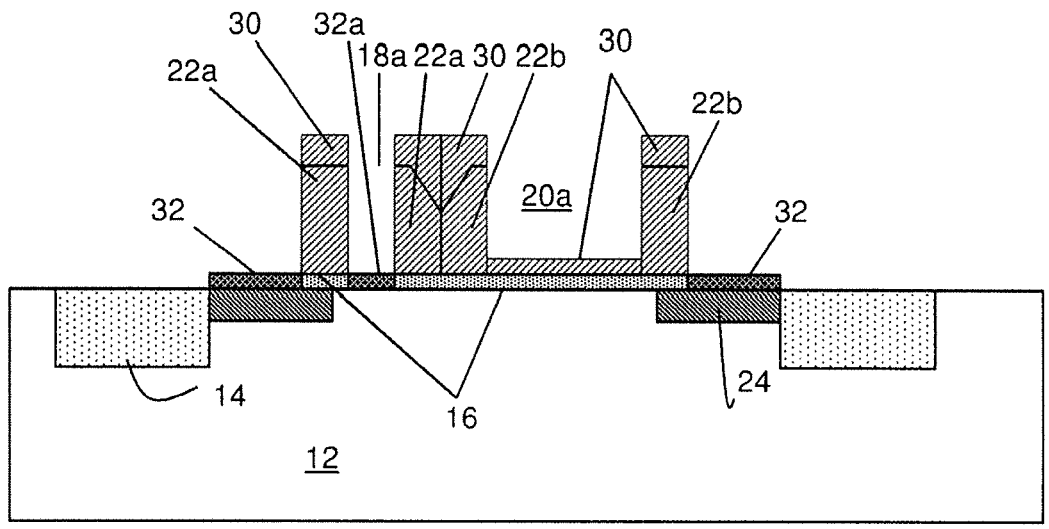

In FIG. 5, portions of the nitride layer 30 and gate dielectric material 16 are removed using conventional lithography and etching processes. For example, a resist is deposited and subsequently patterned to expose portions of the nitride layer 30 over at least the STI regions 14, source and drain regions 24 and the space 18a formed by the removal of line 18. The resist will protect all other regions including the nitride material 30 between the sidewall spacers 22b, 22b, e.g., the space 20a formed by the removal of line 20. This space can be adjusted in order to tune the voltage breakdown, for different capabilities. An etching process (RIE or wet etch) is then performed to remove the exposed nitride layer 30 and underlying gate dielectric material 16. In embodiments, two different etching processes with different chemistries can be performed to remove these separate materials, e.g., nitride layer 30 and gate dielectric material 16. The resist can then be removed by conventional processes as described herein.

Still referring to FIG. 5, silicide regions 32 are formed in contact with the source and drain regions 24. Also, a silicide region is formed as the gate structure 32a for a MESFET. As shown in FIG. 5, the gate structure 32a is spaced away (e.g., remote) from the source region 24 to prevent shorting. In embodiments, the silicide regions 32 and gate structure 32a are formed by deposition of a metal and a subsequent annealing process. In embodiments, the metal material can be, for example, titanium, cobalt, nickel, platinum or other known metals or metal alloys or combinations thereof. The metal material can be deposited to a thickness of about 300 Å to about 1000 Å; although other dimensions are also contemplated by the present invention. The anneal process can be a conventional anneal, e.g., ranging from a few seconds to a several minutes at temperatures of about 300° C. to 1000° C. As should be understood by those of skill in the art, the source and drain regions 24 are both self-aligned to the gate 32a, and drain to gate distance (e.g., space 20a) can be tuned based on the width of the line 20 which is removed in subsequent processing steps.

Figure 6:
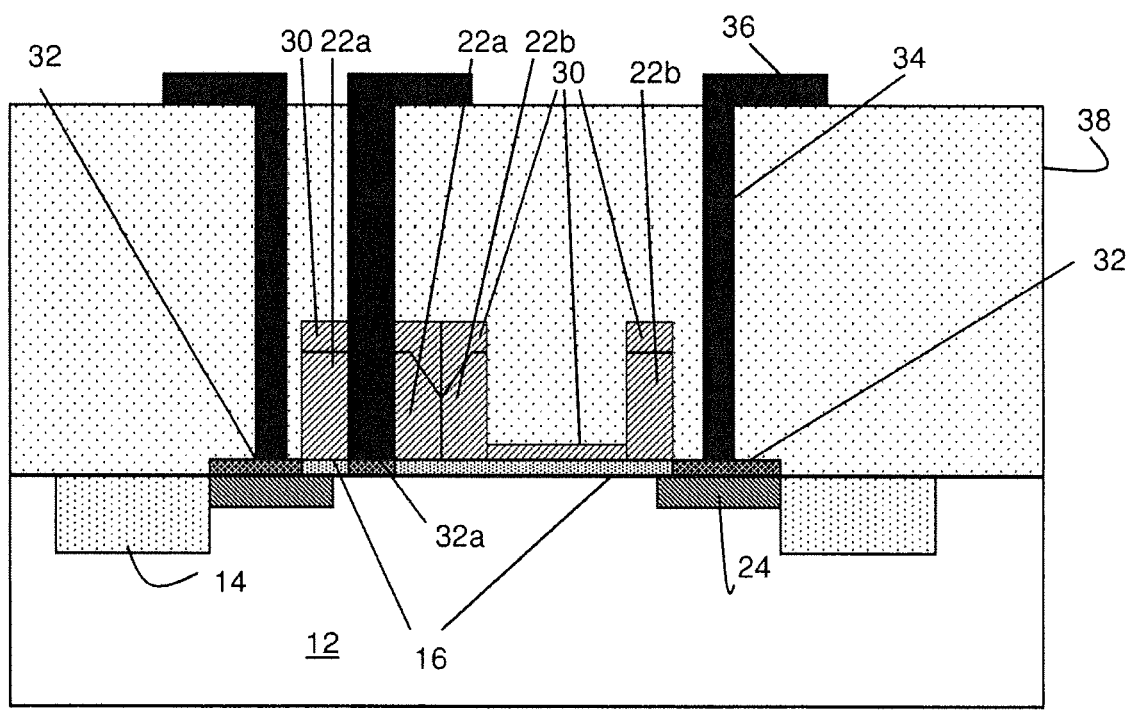

FIG. 6 shows further processing steps and a respective structure in accordance with aspects of the present invention. In particular, in FIG. 6, contacts 34 and wiring structures 36 are formed in direct electrical contact with the suicide regions 32 and gate structure 32a. The contacts 34 and wiring structures 36 are formed by conventional CMOS processes. For example, interlevel dielectric material (ILD) 38 is deposited and patterned using conventional lithography and etching (RIE) processes. The ILD 38 can be back end of the line (BEOL) materials such as Borophosphosilicate glass (BSPG) or undoped silicate glass (USG). After via formation, metal material e.g., copper or aluminum, is deposited in the vias and any excess material is removed from a surface of the ILD 38 using, e.g., CMP processes. The wiring structure 36 can then be formed by a deposition and patterning processes.

Figure 7:
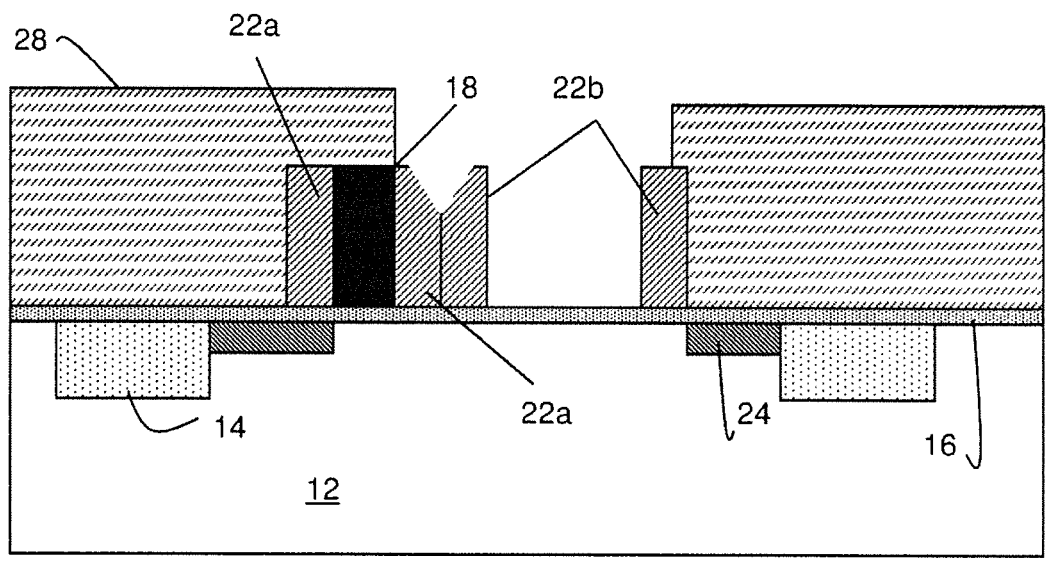
FIGS. 7-10 show processing steps and respective structures for forming MOSFETs, in accordance with aspects of the present invention.

FIGS. 7-10 show processing steps and respective structures for the formation of a MOSFET in accordance with aspects of the present invention. Referring to FIG. 7, a resist 28 is formed on substrate 12, with its pattern exposing line 20 (shown in FIG. 2). In embodiments, the resist boundary covers the line 18 and the outermost spacer 22b, thereby protecting the line 18 during etching processes. The line 20 is then removed using conventional etching processes, e.g., RIE or wet etch, selective to its material. Line 18 and the underlying gate dielectric material 16 will form a gate structure.

Figure 8:
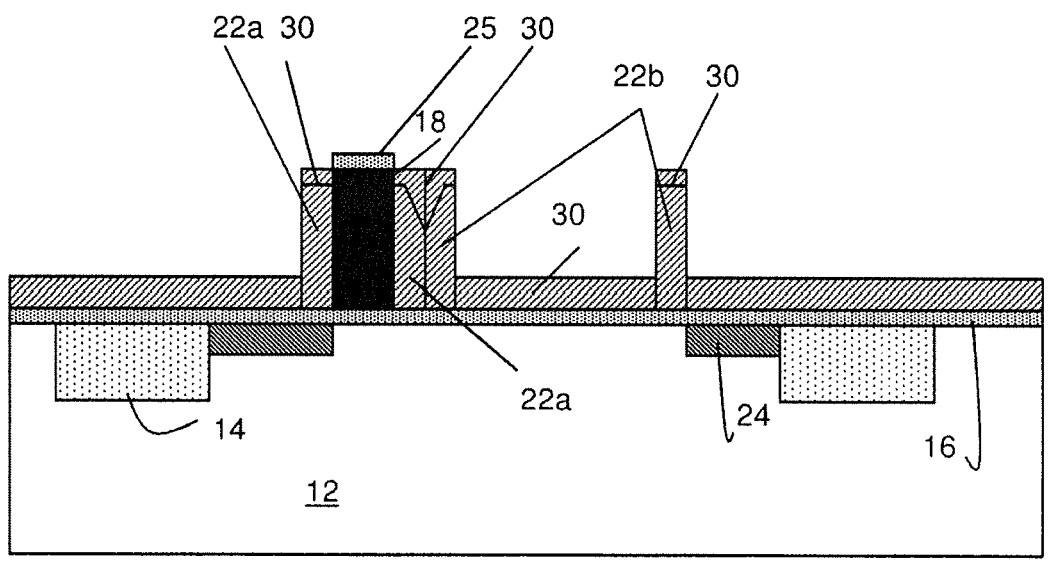

In FIG. 8, the resist is removed and a nitride layer 30 is conformally formed on the structure and a dielectric layer 25 is also formed over line 18. More specifically, in embodiments, the resist can be removed by, for example, an oxygen ashing process or other known stripping method. The nitride layer 30 is formed by a CVD conformal deposition process over the exposed portions of the spacers 22a and 22b, and the gate dielectric material 16. In embodiments, the nitride layer 30 can be an oxynitride or other blocking material.

Figure 9:
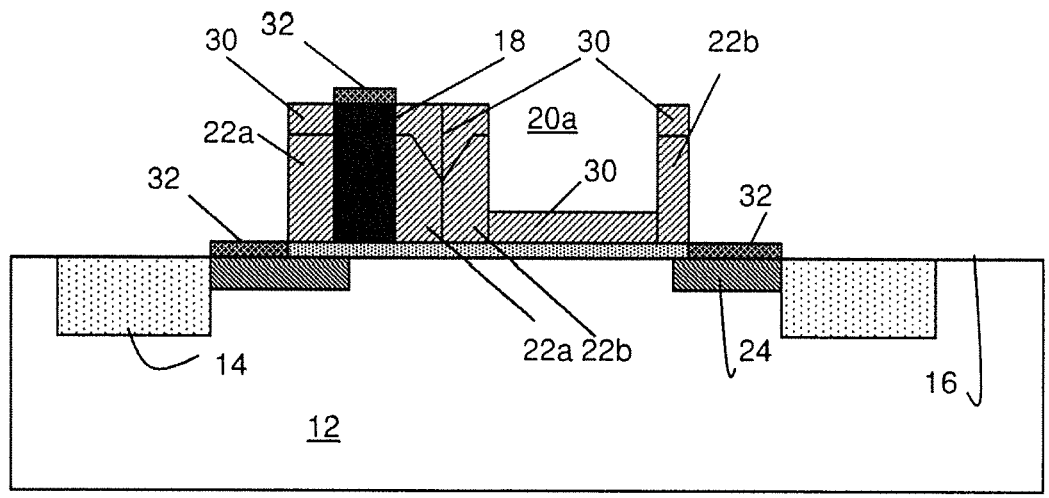

In FIG. 9, portions of the nitride layer 30 and gate dielectric material 16 are removed on the horizontal surfaces using conventional lithography and etching processes. For example, a resist is deposited and subsequently patterned to expose portions of the nitride layer 30 over at least the STI regions 14, source and drain regions 24 and the line 18. The resist will protect all other regions including the nitride material 30 between the sidewall spacers 22b, 22b, e.g., the space 20a formed by the removal of line 20. An etching process (RIE) is then performed to remove the exposed portions of the nitride layer 30 and underlying gate dielectric material 16. In embodiments, two different etching processes with different chemistries can be performed to remove these separate materials, e.g., nitride layer 30 and gate dielectric material 16. The resist can then be removed by conventional processes as described herein.

Still referring to FIG. 9, silicide regions 32 are formed in contact with the source and drain regions 24 and line (gate structure) 18. In embodiments, the silicide regions 32 are formed by deposition of a metal and a subsequent annealing process. In embodiments, the metal material can be, for example, titanium, cobalt, nickel, platinum or other known metals or metal alloys or combinations thereof. The metal material can be deposited to a thickness of about 300 Å to about 1000 Å; although other dimensions are also contemplated by the present invention. The anneal process can be a conventional anneal, e.g., ranging from a few seconds to a several minutes at temperatures of about 300° C. to 1000° C. As should be understood by those of skill in the art, the source and drain regions 24 are both self-aligned to the gate 32a, and drain to gate distance (e.g., space 20a) can be tuned based on the width of the line 20 which is removed in subsequent processing steps.

Figure 10:
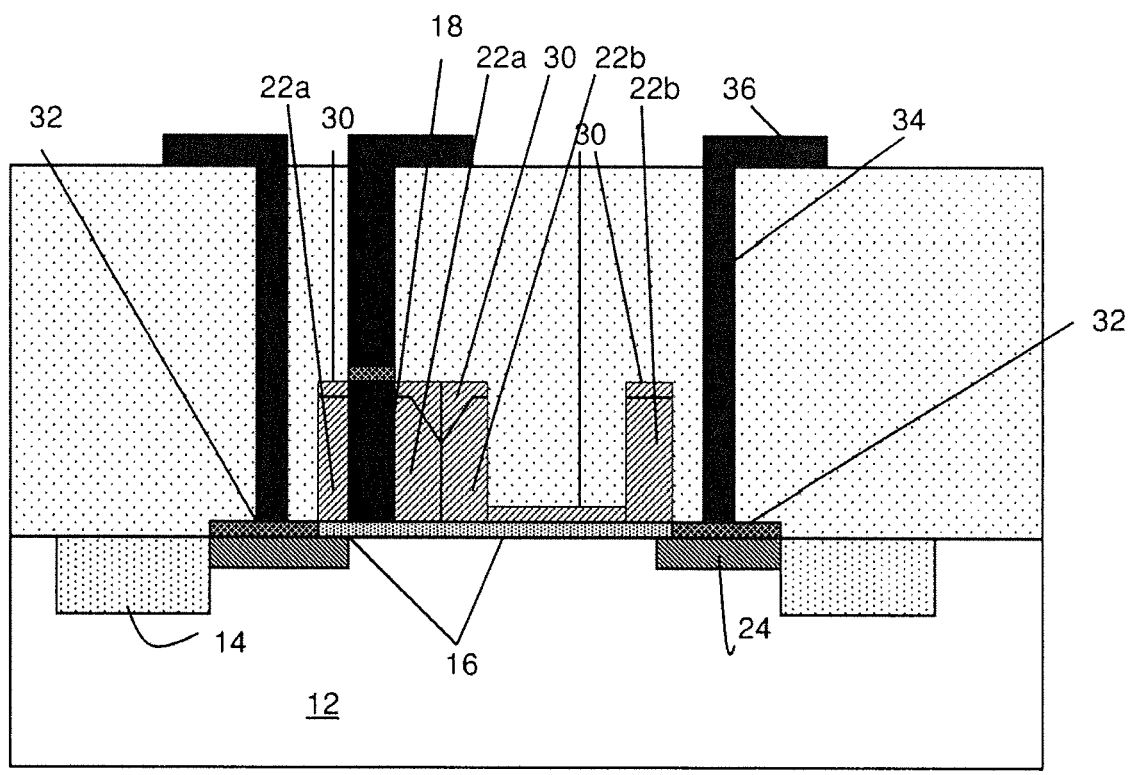

In FIG. 10, contacts 34 and wiring structures 36 are formed in direct electrical contact with the silicide regions 32. The contacts 34 and wiring structures 36 are formed by conventional CMOS processes as already described herein.

Figure 11:
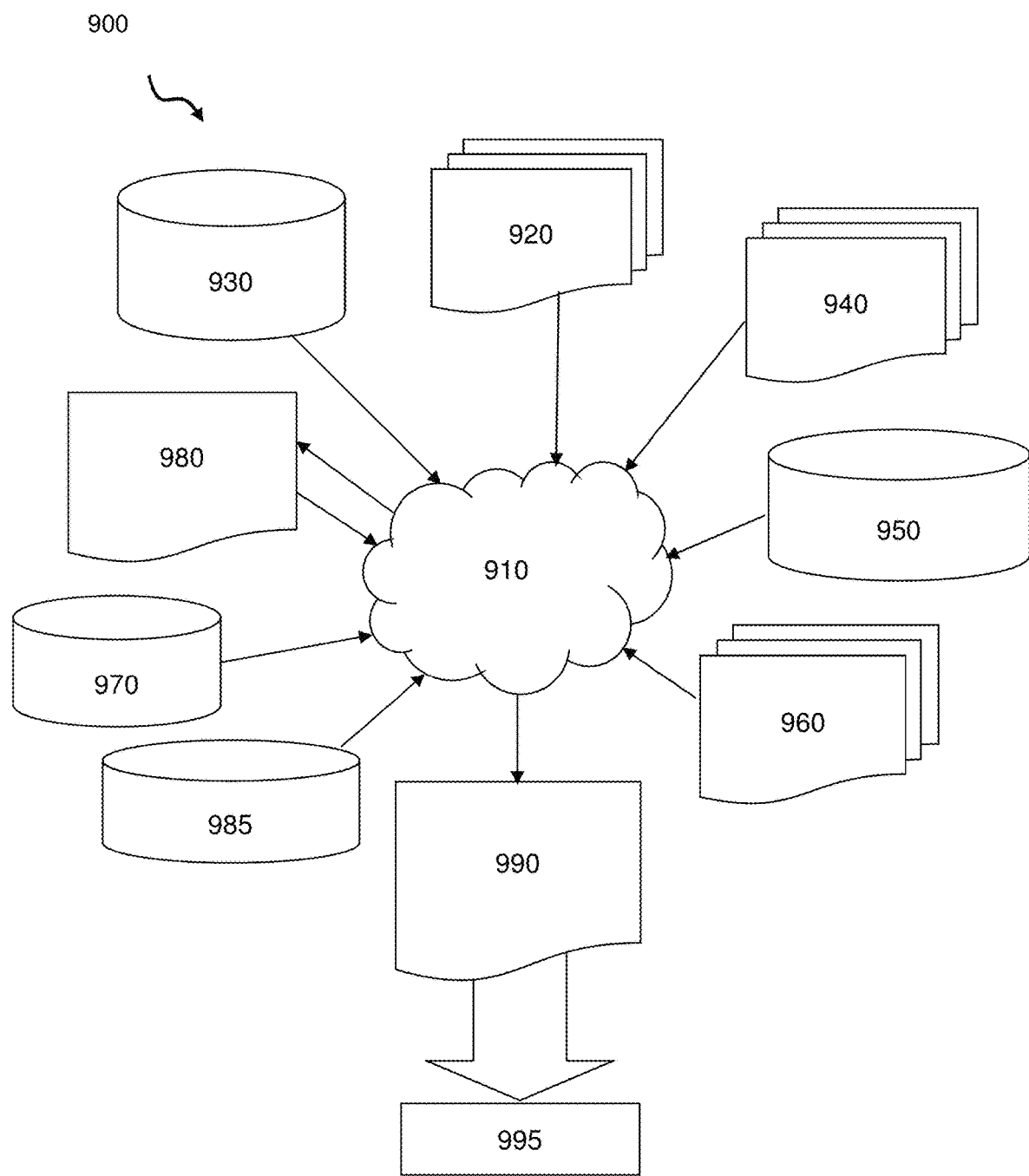
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a gate dielectric material on a substrate;
    first, second and third silicide regions directly on the substrate, and adjacent to and each directly contacting the gate dielectric material;
    sidewall spacers directly contacting a top surface of the gate dielectric material, the sidewall spacers comprising a first sidewall spacer, a second sidewall spacer, a third sidewall spacer and a fourth sidewall spacer, the first sidewall spacer, the second sidewall spacer, the third sidewall spacer and the fourth sidewall spacer each comprising a side surface;
    a source region adjacent to the first silicide region;
    a drain region adjacent to the second silicide region;
    the third silicide region being aligned between the first sidewall spacer and the third sidewall spacer, and further spaced apart and positioned between the first silicide region and the second silicide region;
    a blocking material directly on the top surface of the gate dielectric material between the second sidewall spacer and the fourth sidewall spacer;
    an ILD layer over the blocking material and which is different than the blocking material; and
    contacts to the first silicide region, the second silicide region, the third silicide region, and the source and drain regions,
    wherein a contact to the third silicide region is in direct contact with the sides of the first sidewall spacer and the third sidewall spacer, and a second contact and a third contact are spaced away and not in contact with the first sidewall spacer, the second sidewall spacer, the third sidewall spacer and the fourth sidewall spacer, and
    wherein a side surface of the first silicide region is vertically aligned with the side surface of the first sidewall spacer, and a side surface of the second silicide region is vertically aligned with the side surface of the fourth sidewall spacer.

2. The structure of claim 1, wherein the third silicide region is formed as a gate structure for a metal-semiconductor field effect transistor.

3. The structure of claim 2, wherein the gate structure is spaced away from the source region to prevent shorting.

4. The structure of claim 3, wherein the gate dielectric material abuts the gate structure.

5. The structure of claim 4, further comprising a space between the gate structure and the drain region.

6. The structure of claim 1, wherein the contact to the third silicide region is positioned between the first sidewall spacer and the second sidewall spacer.

7. The structure of claim 1, wherein the source and drain regions are self aligned.

8. The structure of claim 1, wherein the substrate is silicon on insulator (SOI) substrate.

9. The structure of claim 1, wherein the blocking material is a nitride layer directly over the gate dielectric material.

10. The structure of claim 9, wherein the nitride layer is an oxynitride layer.

11. The structure of claim 10, wherein the second silicide region is aligned with the fourth sidewall spacer and spaced apart from the source region.

12. The structure of claim 11, wherein the blocking material on the gate dielectric material is completely within an opening between the second sidewall spacer and the fourth sidewall spacer.

13. The structure of claim 12, wherein the third silicide region is formed as a gate structure for a metal-semiconductor field effect transistor.

14. The structure of claim 13, wherein the opening is adjustable for tuning a drain to gate distance with respect to the drain region adjacent to the second silicide region and the gate structure.

15. The structure of claim 14, wherein tuning the drain to gate distance tunes a breakdown voltage of the metal-semiconductor field effect transistor for different capabilities.

16. The structure of claim 15, further comprising an ILD material over the nitride layer within the opening between the second sidewall spacer and the fourth sidewall spacer, and the ILD material is on opposing side surfaces of the sidewall fourth sidewall spacers.

17. The structure of claim 16, further comprising shallow trench isolation (STI) regions adjacent to the source region and the drain region, wherein the ILD material covers a top surface of the STI regions.

18. A structure comprising:
    a gate dielectric material on a substrate;
    first, second and third silicide regions directly on the substrate, and each directly contacting the gate dielectric material;
    sidewall spacers directly contacting a top surface of the gate dielectric material, the sidewall spacers comprising a first sidewall spacer, a second sidewall spacer, a third sidewall spacer and a fourth sidewall spacer, the first sidewall spacer, the second sidewall spacer, the third sidewall spacer and the fourth sidewall spacer each comprising a side surface;
    a source region adjacent to the first silicide region;
    a drain region adjacent to the second silicide region;
    the third silicide region being aligned between the first sidewall spacer and the third sidewall spacer, and further spaced apart and positioned between the first silicide region and the second silicide region;
    contacts to the first silicide region, the second silicide region, the third silicide region, and the source and drain regions,
    an interlevel dielectric material (ILD) material over a blocking material within the opening between the second sidewall spacer and the fourth sidewall spacer, wherein
    the blocking material is in contact with the gate dielectric material,
    the ILD material is on at least opposing side surfaces of the second sidewall spacer and the fourth sidewall spacer,
    the ILD material is different than the blocking material, and
    a side surface of the first silicide region is vertically aligned with the side surface of the first sidewall spacer, and a side surface of the second silicide region is vertically aligned with the side surface of the fourth sidewall spacer.

19. The structure of claim 18, wherein the blocking material is a nitride layer.

20. The structure of claim 18, further a contact to the third silicide region is in direct contact with the sides of the first sidewall spacer and the third sidewall spacer, and a second contact and a third contact are spaced away and not in contact with the first sidewall spacer, the second sidewall spacer, the third sidewall spacer and the fourth sidewall spacer, and the ILD material is provided over all exposed surfaces of the sidewall spacers, the first silicide region and the second silicide region.

* * * * *